(12) United States Patent
Vilain

(10) Patent No.: US 7,148,481 B2
(45) Date of Patent: Dec. 12, 2006

(54) DEVICE FOR DETECTING INFRARED RADIATION WITH BOLOMETRIC DETECTORS

(75) Inventor: Michel Vilain, Saint Georges de Commiers (FR)

(73) Assignee: Ulis, Veurey Voroize (FR)

( * ) Notice: Subject to any disclaimer, the term of this patent is extended or adjusted under 35 U.S.C. 154(b) by 116 days.

(21) Appl. No.: 10/982,335

(22) Filed: Nov. 5, 2004

(65) Prior Publication Data

US 2005/0098727 A1    May 12, 2005

(30) Foreign Application Priority Data

Nov. 10, 2003  (FR) .................................. 03.13181

(51) Int. Cl.
*G01J 5/00* (2006.01)
(52) U.S. Cl. .................................. 250/338.1
(58) Field of Classification Search .............. 250/338.1
See application file for complete search history.

(56) References Cited

U.S. PATENT DOCUMENTS

| | | | |
|---|---|---|---|
| 5,554,849 A | 9/1996 | Gates | |
| 6,064,066 A | 5/2000 | Bevan et al. | |
| 6,080,987 A | 6/2000 | Belcher et al. | |
| 6,157,404 A | 12/2000 | Marshall et al. | |
| 6,249,002 B1 | 6/2001 | Butler | |
| 6,441,413 B1 | 8/2002 | Endoh | |
| 2001/0003356 A1* | 6/2001 | Yon et al. | 250/338.1 |
| 2003/0201395 A1* | 10/2003 | Yon et al. | 250/338.1 |
| 2004/0200961 A1* | 10/2004 | Parrish et al. | 250/338.1 |

FOREIGN PATENT DOCUMENTS

| | | |
|---|---|---|
| EP | 0 721 226 A2 | 7/1996 |
| GB | 2 200 246 A1 | 7/1988 |

* cited by examiner

*Primary Examiner*—Constantine Hannaher
(74) *Attorney, Agent, or Firm*—Burr & Brown

(57) ABSTRACT

An infrared detection device including a matrix of bolometric detectors electrically connected to a reading circuit. Each of the detectors includes at least two electrically conductive thermal insulation structures insulated from one another and fitted in contact at one of their ends with an active zone consisting of a bolometric material. One of the structures is electrically connected at its other end to the reading circuit by a cold electrical connection that is kept at a substantially constant potential. The other structure is electrically connected at its other end to the reading circuit by a hot electrical connection, which is connected in series with a switch integrated into the reading circuit. At least two adjacent bolometric detectors are connected by a common electrical connection to the substantially constant potential of the reading circuit.

2 Claims, 4 Drawing Sheets

DEVICE FOR DETECTING INFRARED RADIATION WITH BOLOMETRIC DETECTORS

CROSS REFERENCE TO RELATED APPLICATION

This application claims the benefit of French Application 03.13181, filed Nov. 10, 2003, the entirety of which is incorporated herein by reference.

FIELD OF THE INVENTION

The present invention relates to a device for detecting infrared radiation using bolometric detectors. In particular, the invention is to be used in the field of infrared imaging.

BACKGROUND OF THE INVENTION

In the field of infrared detectors, it is known to use devices which are arranged in a matrix form and can operate at room temperature, that is to say they do not need to be cooled to very low temperatures, unlike the detection devices referred to as quantum detectors which for their part need to operate at a very low temperature, typically that of liquid nitrogen.

These uncooled detectors traditionally use the variation in a physical quantity of a suitable material as a function of the temperature in the vicinity of 300 K. In the case of bolometric detectors, this physical quantity is the electrical resistivity.

An uncooled detector generally combines:

means for absorbing the infrared radiation and converting it into heat;

means for thermally insulating the detector so as to allow it to be heated under the effect of the infrared radiation;

thermometry means which, in the context of a bolometric detector, use a resistive element;

and means for reading the electrical signals delivered by the thermometry means.

Detectors intended for infrared imaging are arranged in the form of a one-dimensional or two-dimensional matrix of elementary detectors on a substrate, generally made of silicon, which includes means for electrically exciting the said elementary detectors and means for pre-processing the electrical signals generated by these elementary detectors.

These means for electrical excitation and pre-processing are formed on the substrate and constitute a reading circuit.

Monolithic integration of the detectors into the corresponding reading circuit is advantageous in terms of fabrication costs. However, it is also possible to hybridize a matrix of detectors onto such a reading circuit.

A device including a matrix of elementary detectors and an associated reading circuit is generally placed in a casing and is connected, in particular electrically, to the external environment by conventional techniques. The pressure in such a casing is reduced in order to limit the thermal losses. This casing is furthermore provided with an infrared window transparent for the radiation to be detected.

In order to observe a scene by means of such a device, the scene is projected through suitable optics onto the matrix of elementary detectors constituting an "imaging retina", and cadenced electrical stimuli are applied by means of the reading circuit (also intended for this purpose) to each of the elementary detectors, or each row of such detectors, in order to obtain an electrical signal constituting the image of the temperature reached by each elementary detector. This signal is processed in a fairly elaborate way by the reading circuit, then optionally by an electronic device outside the casing, in order to generate a thermal image of the observed scene.

The performance of uncooled bolometric detectors depends essentially on:

expertise in developing and integrating the highest-performance bolometric detectors; expertise in the techniques of constructing the bolometric detectors;

the working quality of the techniques for reading and addressing these detectors and various corrective functions which are used in the reading circuit and in other auxiliary devices;

and expertise in the techniques of packaging at a low pressure in a leaktight casing.

The present invention more particularly pertains to expertise in the techniques of constructing the bolometric detectors and, inter alia, the quality of the resultant reading and addressing functions of the bolometric detectors. Specifically, it aims to make it possible to obtain very high-performance bolometric detectors by using an advantageous construction technique and without having to resort to complex and risky addressing ploys.

The prior art describes various ways of producing elementary detectors, or for addressing them.

A schematic representation of a prior art bolometric detector is illustrated in conjunction with FIG. 1, of which FIG. 2 is a view in section along the line A—A of FIG. 1.

This detector basically comprises a sensitive active zone (5) essentially consisting of a bolometric material, that is to say a sensitive material whose resistivity varies with the temperature. This active zone (5) is constructed in the form of a membrane suspended above the reading circuit (1) by means of two structures (4) with an elongate shape.

Each of the two structures (4) is electrically conductive and connected, at its other end from the active zone (5), to the reading circuit (1) by means of an essentially vertical electrical connection (3) so as to keep the membrane (5) at a distance of the order of 1.5 to 2.5 micrometers above the reading circuit, this being in order to optimize the detection around a wavelength of 10 micrometers corresponding to the useful detection range of this type of detector.

The reading circuit (1) is itself traditionally covered with a reflective metal layer intended to send back the infrared radiation not absorbed by the membrane (5).

The structures (4) are therefore electrically conductive but also, and importantly, thermally resistive. This thermal resistance $R_{th}$, referred to in particular as "thermal insulation", is intended to make it possible for the bolometric material (5) to be heated under the effect of the radiation, particularly infrared radiation.

This zone (5) comprises a "thermometer" constituted by an electrical resistor $R_b$ consisting of the bolometric material, that is to say material which is sensitive to the temperature variations; but as well as the means for absorbing the infrared radiation, it also comprises means for electrically connecting the two electrical poles of this resistor to the structure (4).

The bolometric material is usually a vanadium oxide (Vox) or amorphous silicon, or a similar amorphous material such as silicon alloyed with germanium and/or carbon, but this list does not imply any limitation.

Among the main performance factors of a microbolometer, the "fill factor" Ff is predominant.

This factor is defined by the ratio of the useful surface area to the total surface area A of the microbolometer. The useful surface area may be regarded as being the surface area on which the infrared radiation is actually absorbed, and is transmitted to the resistor $R_b$. In a traditional matrix structure consisting of elementary points which are identical (to within a rotation or a symmetry) the total surface area A should be understood as the product of the repetition increment along each of the two dimensions of the plane containing the matrix:

$$A = [X \text{ increment}] \cdot [Y \text{ increment}]$$

Another essential factor in the performance of a microbolometer involves the surface area Sr over which the resistor $R_b$ extends. The reason is this resistor has its own electrical noise, generally dominated by the low-frequency noise $N_{LF}$ in 1/f, which is a characteristic particularly of amorphous bolometric materials. It can be shown that the signal-to-noise ratio of the microbolometers is proportional to the factor $Sr^{1/2}$ under optimal excitation conditions, at least for this type of bolometric material.

The performance of a bolometric detector is traditionally expressed by the thermal resolution NedT (standing for "Noise Equivalent Differential Temperature") which is defined by the temperature variation producing a signal equivalent to the noise of the elementary detector. It may be demonstrated that the thermal resolution is quantified by the relation:

$$\frac{1}{NedT} = k \cdot A \cdot Ff \cdot Sr^{1/2} \cdot R_{th}$$

where k is a proportionality parameter which incorporates the passband of the reading circuit, the level of low-frequency noise in 1/f of the bolometric material, the infrared absorption efficiency of the elementary detectors per unit surface area, and the relative variation coefficient of the resistor $R_b$ with the temperature.

Assuming for simplicity that the resistor $R_b$ essentially occupies the effective surface area A·Ff, we can write $$\frac{1}{NedT} = k' \cdot (A \cdot Ff)^{3/2} \cdot R_{th}$$

It is therefore apparent that the parameters of total area A and fill factor Ff play an essential role in optimization of the microbolometer, and more particularly when attempting to reduce its dimensions in order to obtain imaging matrices which are as small as possible.

This point is essential for the fabrication cost of the detector integrated in the overall imaging system provided with its optics, as for example in a camera.

It therefore appears more particularly beneficial to produce microbolometers which include a reduced number of connections, because these elements are installed to the detriment of the factor Ff.

A part of a traditional microbolometer matrix, formed with the aid of the microbolometer in FIG. 1, has been represented in conjunction with FIG. 3.

In the example which is illustrated, this is composed of three lines and two columns. Each microbolometer is schematized by its active zone (5) and its connections to the reading circuit, respectively (3a) and (3b).

As can be seen in FIG. 3, each bolometric detector is connected via one of its connections (3a) to a switch (7) formed within the reading circuit (1) and by the other connection (3b) directly to a conductive line (6), which is formed in the reading circuit and is kept at an essentially constant potential, typically delivered by a low-impedance supply. In the example which is represented, the potential of this line (6) has been represented by the conventional symbol for electrical earth. This connection (3b) is therefore commonly referred to as a cold point. Bolometric detector matrices are conventionally read line by line, at a frequency selected so that the time taken to read all the lines corresponds to the video frame time, that is to say the time between two consecutive complete images.

A current integrator formed in the reading circuit (1) is traditionally arranged at the end of each column, and the current delivered by the corresponding elementary detector of the line being read is injected into it simultaneously for each column, through the switch (7) closed by the activation of a line addressing switch (not shown for the sake of simplicity).

The effect of this addressing switch is to close all the switches (7) of the same line (only one of which, corresponding to the right-hand column, is represented in the various figures).

This current is obtained by temporarily applying a voltage between the two connections of each detector of the same row for a period referred to as the integration time. After this integration time, the signals delivered by each integrator are transferred in series to an output amplifier (also not shown), while the line just read is disconnected by opening the switches (7) in response to the state inversion of the line addressing switch, and the next line is addressed by activating an addressing switch of the next line. All the functions are carried out with the aid of circuitry elements which are traditional in microelectronics.

Correspondingly, the connection (3A) of each bolometric detector is referred to as a hot point, in so far as the current applied by the reading circuit is time-variable.

An embodiment of document U.S. Pat. No. 6,249,002, and particularly its FIG. 3, describes a particular architecture of the connections of the microbolometers in a matrix, which is intended to limit the total number of connections of the matrix. This embodiment has been schematized in conjunction with FIG. 4. According to the teachings of this document, each detector (5) includes two connections (3) with the reading circuit, each of these connections being shared by an immediately adjacent detector above and below in the same column.

This particular arrangement thus makes it possible to limit the number of connections to a number less than 2n times the number of detectors in the matrix, where n represents the total number of detectors. In this configuration, the detectors of the first and last lines necessarily include a connection connected to a single detector, the number of connections therefore being more than n.

Although this configuration makes it possible to effectively reduce the number of connections, it nevertheless requires a complex configuration of the addressing system.

In order to connect a particular detector to the amplifier located at the column end when reading a row, it is thus necessary to isolate all the other detectors in the same column in order to avoid stray currents, which could flow in either direction through the other detectors connected in series with the detector being read.

For this purpose, each connection is connected to a pair of switches (7A, 7B) formed in the reading circuit. In order to read a particular detector, the detector at the top right in the example being described, one of the two switches of each pair connected to the two connections of this detector is closed by common activation (represented by the segment in broken lines), and all the other switches connected to all the other connections of the same column are opened.

In order to read the next line, for example the one below the aforementioned detector, the previous two switches are opened and the next pair of switches (7A, 7B) is closed by common activation. In this way, only the detector lying below the previous detector is connected in its turn to the end-of-column integrator.

This particular configuration is valid when all the signals are well-established in steady state.

The permanent presence of the distributed resistance constituted by the entire column of detectors, combined with the distributed capacitance of this column, nevertheless poses serious quality problems for the reading.

FIG. 4 shows for example that when any one detector is being selected, the cold connection of the previous detector in the same column becomes the hot connection of the selected detector, and the hot connection of the next detector (selected during the previous frame) becomes the cold connection of the selected detector.

This results in stray transient charging and discharging currents through the detector being read, which perturb the signal at the ordinary operating frequency.

Even at a low reading frequency, the biasing of the bolometric detector's should preferably be carried out in a pulsed mode, which inherently is very sensitive to the capacitances seen by the hot points, and these capacitances are furthermore different in proximity to the upper and lower edges of the matrix.

This arrangement of hot points results in a kind of lining of the image, with a variable intensity from one line to another depending on the order number of each line in the matrix.

At best, these defects can be eliminated only at the cost of concomitant additional complexity of the reading circuit, in order to control all the potentials at any time and eliminate or homogenize the effect of the hot-point capacitances. This defect seriously detracts from the benefit offered by the reduced number of connections.

SUMMARY OF THE INVENTION

The subject-matter of the present invention concerns a detection device, aiming to reduce the number of connections of the detectors with an associated reading circuit but without producing this lining defect.

This infrared detection device comprises a matrix of bolometric detectors electrically connected to a reading circuit, in which each of the elementary detectors includes at least two electrically conductive thermal insulation structures, which are insulated from one another and are fitted in contact at one of their ends with an active zone consisting of a bolometric material, that is to say a sensitive material whose resistivity varies with the temperature, in which:

one of the said structures is electrically connected at its other end to the reading circuit by means of an electrical connection, which is referred to as a cold connection and is kept at a substantially constant potential;

the other of the said structures is electrically connected at its other end to the reading circuit, also by means of an electrical connection, which is referred to as a hot connection and is itself connected in series with a switch integrated into the reading circuit.

It is characterized in that at least two adjacent bolometric detectors are connected by a common electrical connection to the substantially constant potential of the reading circuit.

This being the case, by no longer assigning the hot connection of each of the bolometric detectors which therefore remains individualized, the lining phenomenon generated by the prior art devices is no longer generated. In parallel, the use of at least one cold connection common to two or more bolometric detectors makes it possible to reduce the number of connections and, consequently, to increase the useful surface area of the resultant detection device and therefore its efficiency in terms of detection.

BRIEF DESCRIPTION OF THE DRAWINGS

The way in which the invention may be embodied, and the advantages which result from this, will become more readily apparent from the following exemplary embodiments which are given by way of indication and without implying any limitation, with reference to the appended figures.

As mentioned above, FIG. 1 is a schematic representation of a prior art bolometric detector, of which

DETAILED DESCRIPTION OF THE INVENTION

Figure 1:
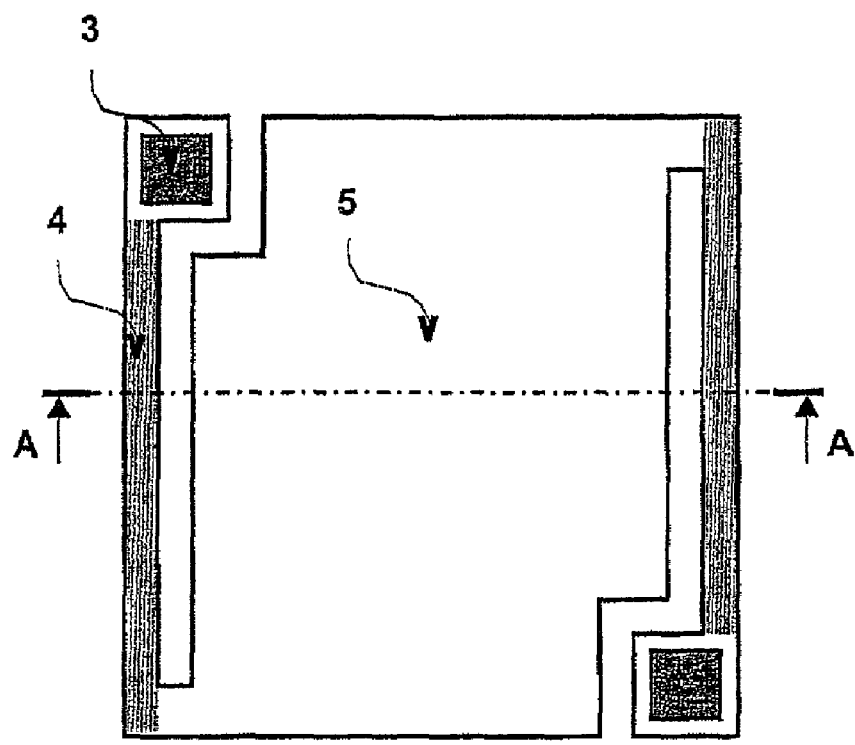
Figure 2:
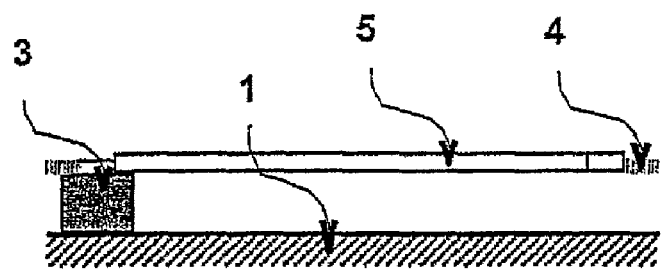
FIG. 2 is a view in section taken on the line A—A of FIG. 1.
Figure 3:
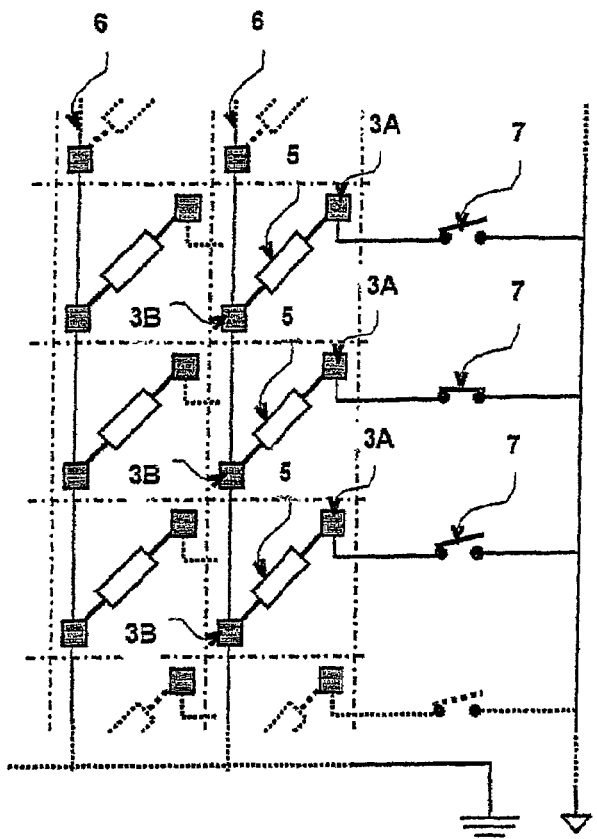
FIG. 3 is a schematic representation of a partial matrix of bolometric detectors according to a traditional configuration.
Figure 4:
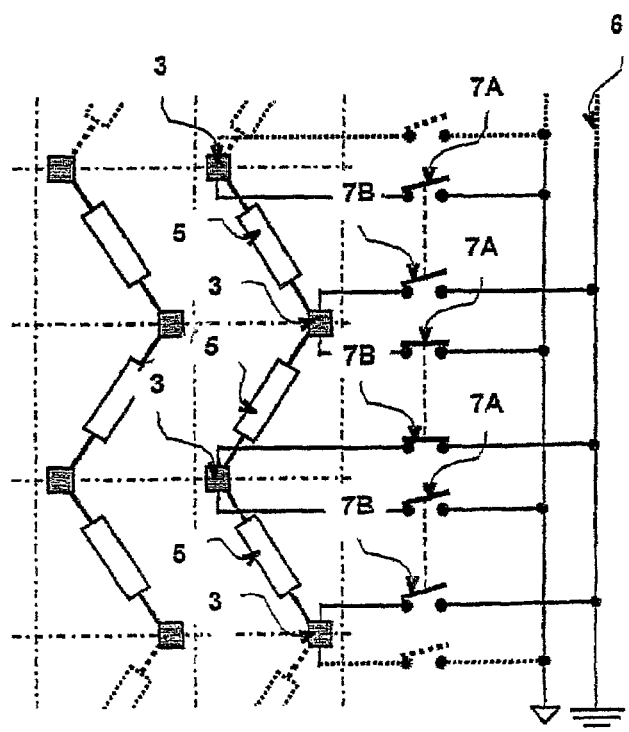
FIG. 4 is a partial schematic representation of a matrix of bolometric detectors according to the teachings of document U.S. Pat. No. 6,249,002.

The bolometric detectors or microbolometers used in the context of the present invention are of a conventional type, and are for example of the type described in conjunction with FIG. 1.

As will already have been understood, the invention relates essentially to a matrix of bolometric detectors and, in particular, to the way in which the said detectors are connected to the reading circuit (1).

Figure 5:
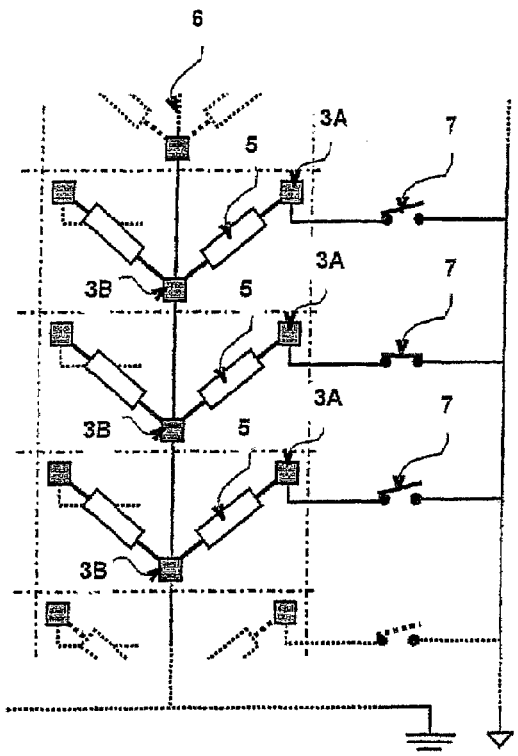
FIG. 5 is a schematic representation of a matrix of bolometric detectors according to a first embodiment of the invention.
Figure 7:
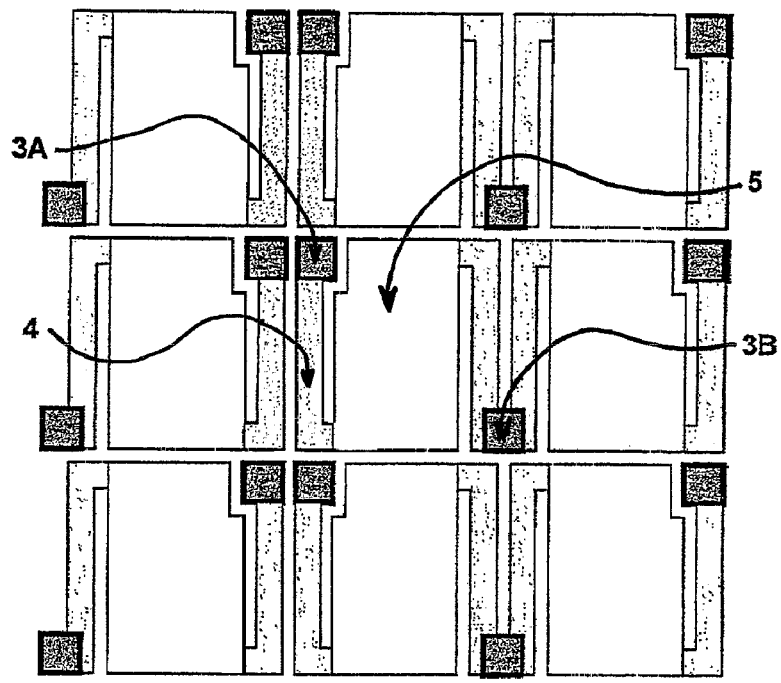
FIG. 7 is a detailed schematic representation of the topographical organization of a 3×3 matrix of elementary detectors, corresponding to the representation in FIG. 5.

In the example described in conjunction with FIGS. 5 and 7, it can be seen that the hot connection (3A) of each of the bolometers (5) is individually connected to a switch (7) of the reading circuit (1). It should be recalled that the switch (7) is closed when reading the microbolometer in question, whereas it remains open for the rest of the time.

Conversely, two bolometers which belong to two adjacent columns and lie on the same line are permanently connected to the reading circuit by the same cold connection (3B), that is to say a connection which is kept at a substantially constant potential.

All of the cold connections (3B) of two adjacent columns are thus connected to the same current line (6) which, as mentioned above, is connected to a substantially constant potential.

Given that the substantially constant potential is common to all the microbolometers of a given matrix, this cold potential line (6) is identical every two columns.

Figure 6:
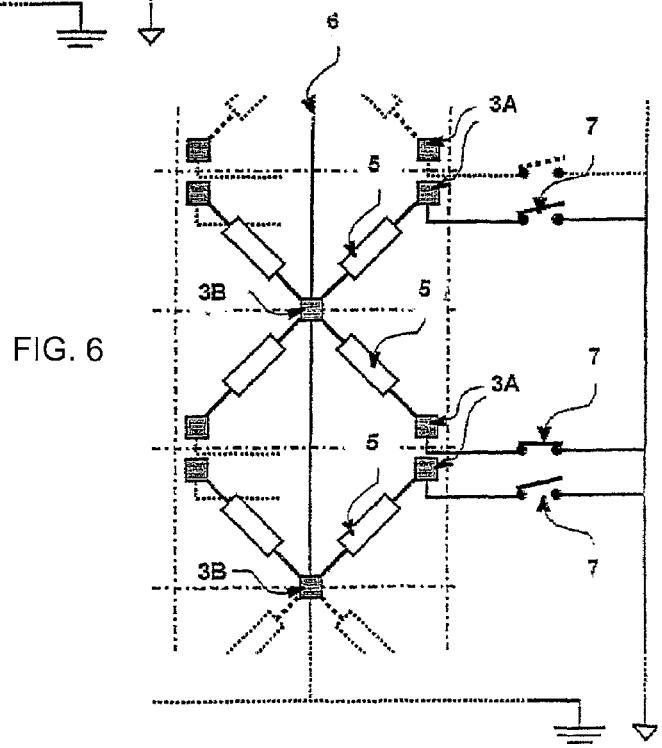
FIG. 6 is a schematic representation of a matrix of bolometric detectors according to a second embodiment of the invention.
Figure 8:
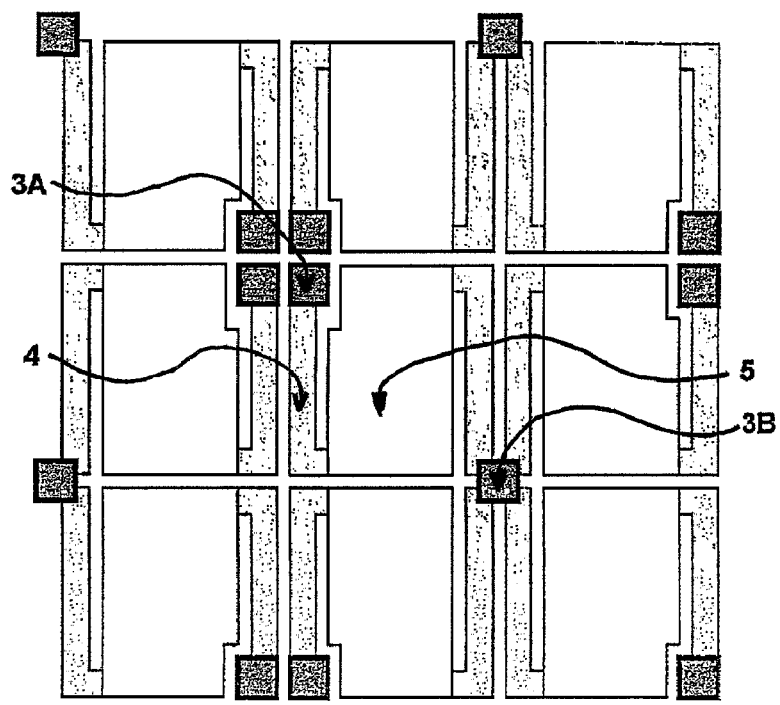
FIG. 8 is a detailed schematic representation of the topographical organization of a 3×3 matrix of elementary detectors, corresponding to the representation in FIG. 6.

The same governing principle is applied in the embodiment of the invention represented in conjunction with FIGS. 6 and 8, except this time it affects four microbolometeric detectors belonging to two adjacent columns and two adjacent lines. In this configuration, each of the bolometric detectors is connected to the reading circuit by an individual hot connection (3A), each of the said connections being itself connected to a single switch (7). These four microbolometer detectors, however, share the same cold connection (3B) which is itself connected to the cold potential line, that is to say the substantially constant potential. Here again, there is an identical cold potential line (6) every two columns.

This particular arrangement has the advantage of reducing even further the number of connections in the matrix.

Although the embodiments represented in conjunction with FIGS. 5 and 6 respectively present a common cold connection for two or four bolometric detectors, it should be clearly understood that any number of microbolometers may share the same cold connection, in particular more than four of them.

The addressing sequence of such a sequence of microbolometers is based on the traditional technique of opening and closing the switches (7) in a sequence controlled by a clock, and dedicated switches (not shown), which does not need to be described in further detail here because it is well known to the person skilled in the art.

It should be noted that each of the bolometric detectors is insulated at its hot connection, which is individual to it, from the other detectors in a given matrix.

This being the case, there is no degradation of the individual signal by stray currents since the hot connection of each of the microbolometers is individualized, as mentioned above, and is never converted into a cold connection in contrast to the prior art.

In other words, during operation of the matrix there is no alternation in the functions of the connections, in particular successively as a hot connection and a cold connection, with the aforementioned drawbacks and the complexity which such an architecture entails.

Over a space of 30×30 micrometers, for example, the surface area needed to accommodate an individual connection according to the available traditional techniques is typically of the order of 6×6 to 8×8 micrometers.

Assuming a fill factor Ff of the order of 70% for a detection device with 2n connections and in view of the space needed to accommodate thermal insulation structures (4), the configuration of the invention according to FIG. 6, for example, offers a relative space improvement of the order of 5 to 7%, that is to say a detection performance improvement of 7 to 11% which is highly advantageous in the field in question.

More elongated insulation structures may furthermore be envisaged, leading to a better thermal resistance $R_{th}$ and greater ease of constructing or optimizing the functions inside the main body (5) of the microbolometer. This being the case, an overall performance improvement of the order of 10 to 15% is observed.

This advantage is all the more substantial when the dimensions of the elementary detector are reduced in order to decrease the dimensions of the matrix.

This advantage can be obtained by using a traditional electrical circuit without any lining defect, due to capacitive loads of the RC type along the columns as mentioned above in conjunction with the description of the prior art, since each elementary detector is read in isolation with minimum stray capacitances which are constant from one detector to another or from one pixel to another.

The benefit of the invention can therefore be understood both in terms of improving the detection performance, and in terms of reducing the size of the matrices of such detectors.

The invention claimed is:

1. Infrared detection device comprising a matrix of bolometric detectors electrically connected to a reading circuit, in which each of the elementary detectors includes at least two electrically conductive thermal insulation structures, which are insulated from one another and are fitted in contact at one of their ends with an active zone consisting of a sensitive material whose resistivity varies with temperature, in which:
   one of the structures is electrically connected at its other end to the reading circuit by means of an electrical cold connection that is kept at a substantially constant potential;
   the other of the structures is electrically connected at its other end to the reading circuit by means of an electrical hot connection and is itself connected in series with a switch integrated into the reading circuit;
   wherein the matrix contains at least two columns, each column containing at least two bolometric detectors,
   wherein two adjacent bolometric detectors, which belong to two adjacent columns of the matrix and lie on the same line, are connected by a common electrical connection to the reading circuit by the same electrical cold connection, and
   wherein the electrical hot connection of each bolometric detector has its own connection to the reading circuit by its own respective switch integrated into the reading circuit.

2. Infrared detection device according to claim 1, wherein four bolometric detectors, which belong to two adjacent columns and two adjacent lines of the matrix, are connected to the reading circuit by the same cold connection.

* * * * *